United States Patent
Akiba et al.

(10) Patent No.: US 8,986,575 B2
(45) Date of Patent: Mar. 24, 2015

(54) LOW-TEMPERATURE CURABLE CONDUCTIVE PASTE FOR PLATING AND ELECTRIC WIRING USING THE SAME

(75) Inventors: Yuichiro Akiba, Ohtsu (JP); Tomoko Honda, Tokyo (JP); Fujio Takahashi, Tokyo (JP); Shinji Nakata, Tokyo (JP)

(73) Assignees: Toyo Boseki Kabushiki Kaisha, Osaka (JP); Kabushiki Kaisha Toshiba, Tokyo (JP)

( * ) Notice: Subject to any disclaimer, the term of this patent is extended or adjusted under 35 U.S.C. 154(b) by 755 days.

(21) Appl. No.: 12/603,718

(22) Filed: Oct. 22, 2009

(65) Prior Publication Data
US 2010/0101842 A1   Apr. 29, 2010

(30) Foreign Application Priority Data
Oct. 24, 2008  (JP) .................................. 2008-274230

(51) Int. Cl.
| | | |
|---|---|---|
| H01B 1/00 | (2006.01) | |
| H01B 1/12 | (2006.01) | |
| H01Q 1/38 | (2006.01) | |
| C09D 11/10 | (2014.01) | |
| C09D 11/52 | (2014.01) | |
| H01B 1/22 | (2006.01) | |
| H05K 1/09 | (2006.01) | |
| H05K 1/02 | (2006.01) | |
| H05K 3/24 | (2006.01) | |

(52) U.S. Cl.
CPC ................. *H01Q 1/38* (2013.01); *C09D 11/10* (2013.01); *C09D 11/52* (2013.01); *H01B 1/22* (2013.01); *H05K 1/0284* (2013.01); *H05K 1/095* (2013.01); *H05K 3/246* (2013.01); *H05K 2201/0347* (2013.01)

USPC ........ 252/500; 106/31.92; 174/257; 427/98.4

(58) Field of Classification Search
CPC ............................... H01B 1/00; H05K 1/0284
USPC ........ 252/500; 106/31.92; 427/98.4; 174/257
See application file for complete search history.

(56) References Cited

U.S. PATENT DOCUMENTS 8,071,888 B2 * 12/2011 Shiraishi et al. ............... 174/257
2006/0269864 A1 * 11/2006 Tarnawskyj et al. .......... 430/124

FOREIGN PATENT DOCUMENTS

| JP | 08-293213 | * 11/1996 | ............... H01B 1/22 |
| JP | 08-293213 A | 11/1996 | |

(Continued)

OTHER PUBLICATIONS

Merriam-Webster Online Dictionary: http://www.merriam-webster.com/dictionary/dendrite.*

*Primary Examiner* — Khanh Tuan Nguyen
(74) *Attorney, Agent, or Firm* — Leydig, Voit & Mayer, Ltd.

(57) ABSTRACT

A conductive paste containing a conductive powder (A), a vinyl chloride-vinyl acetate resin (B), a polyester resin and/or polyurethane resin (C), a blocked isocyanate (D) blocked with an active methylene compound, and an organic solvent (E), wherein the resin (C) has a glass transition temperature of −50° C. to 20° C., a sum of amounts of the resin (C) is 50 to 400 parts by weight relative to 100 parts by weight of the resin (B), and a sum of amounts of the resin (B), the resin (C) component, and the blocked isocyanate (D) is 10 to 60 parts by weight relative to 100 parts by weight of the conductive powder (A). An electric wiring in which this conductive paste is formed on an insulating substrate.

24 Claims, 4 Drawing Sheets

(56) References Cited

FOREIGN PATENT DOCUMENTS

| JP | 09-194768 A | | 7/1997 | |
| JP | 11-145583 A | | 5/1999 | |
| JP | 2005-056778 | * | 3/2005 | ............... H01B 1/22 |
| JP | 2005-133056 | * | 5/2005 | ............ C08L 101/12 |
| JP | 2006-252807 A | | 9/2006 | |
| JP | 2008-160684 A | | 7/2008 | |
| WO | WO 2006-095611 | * | 9/2006 | ............. C09D 11/10 |

* cited by examiner

LOW-TEMPERATURE CURABLE CONDUCTIVE PASTE FOR PLATING AND ELECTRIC WIRING USING THE SAME

CROSS REFERENCE TO RELATED APPLICATIONS AND INCORPORATION BY REFERENCE

This application is based upon and claims the benefit of priority from prior Japanese Patent Application P2008-274230 filed on Oct. 24, 2008; the entire contents of which are incorporated by reference herein.

TECHNICAL FIELD OF THE INVENTION

The present invention relates to a conductive paste curable at a lower heating temperature compared to the conductive paste of the related art. The conductive paste of the present invention has a printability to pad printing, and also has a printability to various other printing methods such as screen printing. Also, a coating film formed by the conductive paste of the present invention has durability to an electrolytic plating process and to a non-electrolytic plating process. By performing plating on the coating film, a coating film having a further higher electric conductivity can be made. Also, an electric wiring can be formed with a non-plated coating film and/or a plated coating film, and can be used as an electric circuit such as an antenna or a shield. In particular, by forming such an electric wiring on a surface of a housing of an apparatus or appliance, it can greatly contribute to an improvement in the volume efficiency of the apparatus or appliance.

BACKGROUND ART

In accordance with an improvement in the functions, increase in the number of components of mounted circuit devices is inevitable in mobile apparatus such as a personal computer, a portable telephone, a fixed telephone, and a PDA, audio apparatus such as a television set and an audio player, information terminal apparatus such as an information management terminal on the point of sale, and home-use electric appliances such as a cleaner, a refrigerator, an electric rice-cooker, and an air conditioner. On the other hand, products tend to have smaller weight, thickness, length, and scale, so that a breakthrough in the component construction and the mounting method is needed. In order to solve this problem, it is effective to form an electric circuit also on the housing for saving space and reduction of the number of components. In particular, reduction of the mounted antenna volume is demanded in order to meet the multilateral wireless and multi-resonance communication of mobile apparatus such as a personal computer or a portable telephone. If an antenna can be formed directly on a housing, a large volume reduction effect can be expected. For example, a wireless apparatus is proposed in which an incorporated type antenna is formed on a housing (Patent Document 1).

A technique of forming an electric wiring on a resin member is generally referred to as the MID (Molded Interconnect Device) method. The production method is roughly classified into a one-shot method and a two-shot method depending on the number of times for injection molding of a resin composition. Also, there are various ones in the two-shot method. A representative one thereof is the following method. That is, a primary molded article having a predetermined three-dimensional shape is formed by injection molding of a resin composition. Next, after surface roughening of the surface thereof in accordance with the needs, a secondary molded part is formed to cover a region of the surface of this primary molded article other than the region where circuits are to be formed (which may hereafter be referred to as "regions other than the circuits") by insertion molding, thereby to obtain a so-called two-color molded article. Next, a state is made in which a catalyst for non-electrolytic plating is imparted to the entire surface of this two-color molded article. Then, by performing non-electrolytic plating, a conductive layer that will be a circuit having a predetermined pattern is formed in a region on the surface of the primary molded article to which the catalyst has been selectively imparted, thereby to obtain a MID (Patent Document 2). This method has a long production lead time by a complex molding and treating process, and necessitates fabrication of a plural number of exclusive-use molds, thereby increasing the production costs. Also, in the case of changing the circuit design, change must be made starting from a modification of the molds, thereby providing a poor degree of freedom in designing. Also, the costs will rise, so that this method is not practical as a method of forming a wiring on a housing that often tends to have a complex shape.

On the other hand, a circuit made by printing a conductive paste by the screen, pad, gravure, flexo, or the like printing on a substrate made of an insulating material and having various shapes such as a film or a plate is used in various scenes because of having a small weight and being capable of forming printed circuits in various places in various forms. A circuit made from conductive paste alone has a disadvantage of having a considerably higher specific resistance compared to a conventional copper foil or aluminum foil; however, this disadvantage is solved by performing plating on the conductive paste. In recent years, there is a demand for adopting an insulating substrate such as resin having a low heat resistance for a printing substrate. The resin that is commonly used as a housing material of various appliances and apparatus has a low heat deformation temperature. For example, the PC/ABS resin (grade MB2215R for portable telephone housing, manufactured by Mitsubishi Engineering Plastics Co., Ltd.) has a low heat deformation temperature of 92° C., so that a low-temperature curable type conductive paste that is cured by being heated at a lower temperature than this is demanded.

Patent documents 3 and 4 disclose a conductive paste that is suitable for use as a plating underlayer. The curable system used herein, which consists of polyester or polyurethane and isocyanate blocked with an oxime necessitates a heating treatment at about 150° C. in curing, so that it is difficult to apply this to a substrate having a low heat resistance such as polycarbonate. Also, it is possible to perform electrolytic plating that is performed in an acidic plating solution having a temperature around an ordinary temperature; however, exfoliation of the coating film may occur in a non-electrolytic plating process that is exposed to a high temperature and a high alkalinity.

Patent document 5 discloses a conductive paste of thermoplastic type that does not contain a curing agent and a conductive paste having a low curing temperature lowered by compounding a curing catalyst, as a conductive paste that can form a conductive coating film by a heating treatment at 80° C. and for 30 minutes. However, both of these use mainly a polyester resin or a urethane-denatured polyester resin as a binder resin, so that, when the plating solution has a high temperature and a high alkalinity, the binder resin may in some cases be deteriorated to cause exfoliation of the plating immediately after the plating is performed, so that this may be hardly usable as a conductive paste for a plating underlayer. (Patent Documents)

1. Japanese Patent Application Laid-Open (JP-A) No. 2008-160684
2. Japanese Patent Application Laid-Open (JP-A) No. 145583/99
3. Japanese Patent Application Laid-Open (JP-A) No. 293213/96
4. Japanese Patent Application Laid-Open (JP-A) No. 194768/97
5. Japanese Patent Application Laid-Open (JP-A) No. 2006-252807

In view of the above circumstances of the related art, an object of the present invention is to provide a conductive paste being curable by a heating treatment at a low temperature of about 80° C. which is lower than in conventional cases, being capable of withstanding any of the processes of electrolytic plating and non-electrolytic plating, being excellent in printability, and being capable of forming an electric wiring having a further better conductivity by performing plating.

In order to achieve the above described object, the present inventors have made eager analyses and studies, and as a result have found out that a specific conductive paste containing a conductive powder, an organic resin, a curing agent, and an organic solvent has a good conductivity and physical property as a coating film while having a low-temperature curable property, and is excellent in plating property and a printing property, thereby arriving at the present invention.

SUMMARY

An aspect of the present invention is the following (1).

(1) A conductive paste containing a conductive powder (A), a vinyl chloride-vinyl acetate resin (B), a polyester resin and/or polyurethane resin (C), a blocked isocyanate (D) blocked with an active methylene compound, and an organic solvent (E), wherein the resin (C) has a glass transition temperature of −50° C. to 20° C., a sum of amounts of the resin (C) is 50 to 400 parts by weight relative to 100 parts by weight of the resin (B), and a sum of amounts of the resin (B), the resin (C) component, and the blocked isocyanate (D) is 10 to 60 parts by weight relative to 100 parts by weight of the conductive powder (A).

Another aspect of the present invention is the following (2).

(2) A method of manufacturing an electric wiring in which an electric wiring is formed on an insulating substrate by printing and/or applying the conductive paste according to (1) on the insulating substrate, followed by heating.

The conductive paste of the present invention can form a firm coating film by a heating treatment of a relatively low temperature. The formed coating film (coating film not plated yet) exhibits a high conductivity, exhibits a high close-adhesion property to both of an insulating substrate having a relatively high heat resistance such as polyethylene terephthalate, vinyl chloride, or nylon and an insulating substrate having a relatively low heat resistance such as polycarbonate or ABS, and exhibits durability (heat resistance, humidity resistance, heat shock resistance, and coldness resistance) even when exposed to a severe temperature and humidity environment. Also, by further performing plating on the coating film not plated yet, a plated coating film exhibiting a further higher conductivity can be obtained. The coating film not plated yet is excellent in durability to a highly acidic treating solution in electrolytic plating and to a highly alkaline treating solution in non-electrolytic plating, and the plated coating film exhibits durability (heat resistance, humidity resistance, heat shock resistance, and coldness resistance) even when exposed to a severe temperature and humidity environment. In a preferable embodiment, the conductive paste of the present invention shows a good printability for various printing methods such as screen printing, pad printing, flexo printing, and gravure printing, and forms a firm coating film by a heating treatment of a relatively low temperature, so that the conductive paste can form a coating film having various shapes at a high speed and with ease, and hence is suitable for forming an electric wiring on various insulating substrates. The electric wiring is suitable for use in an antenna circuit, a sensor circuit, an electromagnetic shield, a contact point, a heat conduction member, or the like.

BRIEF DESCRIPTIONS OF DRAWINGS

DETAILED DESCRIPTION

Figure 1:
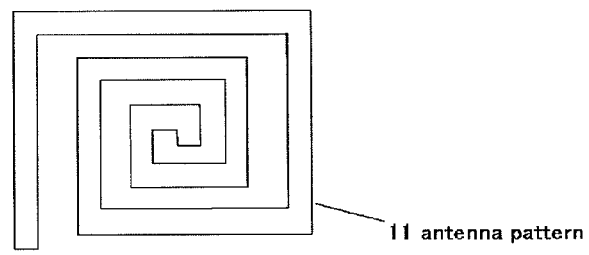
FIG. 1 is a schematic view illustrating one example of an antenna pattern according to an embodiment of the present invention.

As the conductive powder (A) used in the conductive paste of the present invention, one can use a noble metal powder such as silver powder, gold powder, platinum powder, or palladium powder, or a base metal powder such as copper powder, nickel powder, aluminum powder, brass powder, iron powder, zinc powder, or cobalt powder. Also, it is also possible to use a base metal powder that has been plated and/or made into an alloy with use of a noble metal such as silver, or a substance in which an inorganic filler such as silica, talc, mica, barium sulfate, or indium oxide is plated with use of a noble metal such as silver. The conductive powder can be used either alone or as a mixture of different kinds.

The shape of the conductive powder is preferably a dendrite structure in view of the aggregation force to resin. A flaky conductive powder has a weak aggregation force to resin, and hence is liable to be exfoliated when plating is performed. Also, a needle structure provides poor attachment of plating, and can hardly form a uniform circuit.

The conductive paste having a dendrite structure preferably has an average particle size (50% D) of 5 to 15 µm as measured by the light scattering method. More preferably, the average particle size is 8 to 15 µm. When the average particle size is less than 5 µm, the conductivity may sometimes decrease. On the other hand, when the average particle size exceeds 15 µm, the surface smoothness may be aggravated, or a problem such as clogging of the screen template may occur.

The measurement by the light scattering method as referred to herein is carried out as follows. A conductive powder is collected with a microspatula once or twice and is put into a tall beaker of 100 ml. Thereto is charged about 60 ml of isopropyl alcohol, and the conductive powder is dispersed for 1 minute with use of a supersonic homogenizer, and measurement is carried out with use of a microtrack FRA manufactured by Nikkisoh Co., Ltd. with a measurement time of 30 seconds. For example, when the conductive powder is silver powder, a measurement is carried out by assuming the particle refractive index to be 2.25 and the dispersion medium refractive index to be 1.37.

Into the conductive paste of the present invention, non-conductive inorganic fillers such as silica, talc, mica, barium sulfate, and indium oxide can be compounded. By compounding these, the viscosity and the thixotropicity of the ink can be raised, whereby the adjustment of the printability can be made, and a circuit having a fine line pattern can be formed.

The vinyl chloride-vinyl acetate resin (B) used in the conductive paste of the present invention is a copolymer mainly made of vinyl chloride and vinyl acetate components, and further different kind components may be copolymerized. A sum content of the vinyl chloride residue and the vinyl acetate residue of the resin (B) is 50 wt % or more, further preferably 70 wt % or more, and more preferably 85 wt % or more relative to the content of the total resin (B). The resin (B) may be a vinyl chloride-vinyl acetate resin into which different kind components other than vinyl chloride and vinyl acetate resin are not copolymerized, or may be a mixture of two or more kinds of vinyl chloride-vinyl acetate copolymers. When the sum content of the vinyl chloride and the vinyl acetate is low, the durability to the plating solution tends to decrease. Also, the number-average molecular weight of the resin (B) is preferably as high as possible, and is preferably 8,000 or higher, more preferably 10,000 or higher, and further preferably 12,000 or higher. When the number-average molecular weight is low, the hardness and the close adhesion property of the coating film tend to decrease. The upper limit of the number-average molecular weight is not limited; however, it is preferably 80,000 or lower in view of the solubility.

Kinds of the different kind copolymerization components of the resin (B) are not particularly limited; however, it is preferable to copolymerize acrylic acid, vinyl alcohol, hydroxyethyl acrylate, or the like to introduce a polar group such as a hydroxyl group or a carboxyl group. By introduction of a polar group, the paste viscosity can be raised, whereby the printability tends to be good. Also, when a hydroxyl group is introduced, a cross-linking reaction takes place by the blocked isocyanate (D), whereby the durability of the coating film tends to be improved, so that it is particularly preferable. The hydroxyl value (hydroxyl number) of the resin (B) is preferably 50 to 100 mgKOH/g. On the other hand, when a carboxyl group is introduced into the resin (B), the humidity resistance durability of the plated coating film tends to be aggravated though the effect of improving the printability is produced. Therefore, the acid value is preferably 2 mgKOH/g or lower, more preferably 0.5 mgKOH/g or lower, and further preferably 0.1 mgKOH/g or lower.

Specific examples in which different kind components other than vinyl chloride and vinyl acetate are copolymerized are VMCH manufactured by Dow Chemical Co., Ltd. in which maleic acid is copolymerized, VAGH manufactured by Union Carbide Co., Ltd. and TAO manufactured by Nisshin Chemical Industry Co., Ltd. in which vinyl alcohol is copolymerized, and VROH manufactured by Union Carbide Co., Ltd. in which hydroxyalkyl acrylate is copolymerized.

The resin (C) used in the conductive paste of the present invention is a polyester resin and/or a polyurethane resin. The resin (C) may be constituted with one of polyester resin and polyurethane resin alone or may be a mixture of the two.

The polyester resin used as the resin (C) of the present invention preferably has a number-average molecular weight of 10,000 or higher, more preferably 20,000 or higher, and further preferably 25,000 or higher. When the number-average molecular weight is 10,000 or lower, the printability and the plating property tend to decrease. The upper limit is preferably 100,000 or lower in view of the problems of polymerization technique. The reduced viscosity of the above described polyester resin is preferably 0.3 dl/g or higher, more preferably 0.5 dl/g or higher, and further preferably 0.7 dl/g or higher. The glass transition temperature (Tg) of the polyester resin is preferably 20° C. or lower, and more preferably 0° C. or lower. Also, the glass transition temperature is preferably −50° C. or higher. When the glass transition temperature is lower than −50° C., the paste coating film will be soft and the resistance to the plating solution will be poor. Also, when the glass transition temperature is above 20° C., the coating film mixed with vinyl chloride-vinyl acetate resin cannot fully ensure the close adhesion property to the substrate. The polyester resin is polymerized by a known method such as the ester exchange method or the direct polymerization method.

Also, the polyester resin is preferably one in which aromatic dicarboxylic acid is contained at 70 mol % or more, and more preferably 80 mol % or more among the total acid components. When aromatic dicarboxylic acid is contained at less than 70 mol %, the strength of the coating film decreases, and the durability such as heat resistance, humidity resistance, and heat shock resistance may possibly decrease. A preferable upper limit of aromatic dicarboxylic acid is 100 mol %.

Further, the aromatic dicarboxylic acid that is copolymerized with the polyester resin may be, for example, terephthalic acid, isophthalic acid, orthophthalic acid, 2,6-naphthalenedicarboxylic acid, or the like. Among these, it is preferable to use terephthalic acid and isophthalic acid in combination in view of the strength of the coating film to be formed and the solvent solubility of the polyester resin.

Other dicarboxylic acid that is copolymerized with the polyester resin may be, for example, aliphatic dicarboxylic acid such as succinic acid, glutaric acid, adipic acid, sebacic acid, dodecanedicarboxylic acid, or azelaic acid, dibasic acid having a carbon number of 12 to 28, alicyclic dicarboxylic acid such as 1,4-cyclohexanedicarboxylic acid, 1,3-cyclohexanedicarboxylic acid, 1,2-cyclohexanedicarboxylic acid, 4-methylhexahydrophthalic anhydride, 3-methylhexahydrophthalic anhydride, 2-methylhexahydrophthalic anhydride, hydrogenated dicarboxybisphenol A, hydrogenated dicarboxybisphenol S, dimeric acid, hydrogenated dimeric acid, hydrogenated naphthalenedicarboxylic acid, or tricyclodecanedicarboxylic acid, hydroxycarboxylic acid such as hydroxybenzoic acid or lactic acid, or the like. In view of the humidity resistance, sebacic acid, azelaic acid, dimeric acid, and 1,4-cyclohexanedicarboxylic acid are preferable.

Also, trivalent or polyvalent carboxylic acid such as trimellitic anhydride or pyromellitic anhydride or unsaturated dicarboxylic acid such as fumaric acid may be used in combination within a range that does not deteriorate the object of the invention.

For the glycol component that is copolymerized with the polyester resin, a known glycol shown in the following can be suitably used. The glycol component may be, for example, aliphatic glycol such as ethylene glycol, propylene glycol, 1,3-propanediol, 1,4-butanediol, 1,5-pentanediol, 1,6-hexanediol, 1,3-butylene glycol, 2,3-butylene glycol, 2,2-dimethyl-1,3-propanediol, 3-methyl-1,5-pentanediol, 2,2-dimethyl-3-hydroxypropyl-2',2'-dimethyl-3-hydroxypropanate, or 2,2-diethyl-1,3-propanediol, alicyclic glycol such as 1,3-bis(hydroxymethyl)cyclohexane, 1,4-bis(hydroxymethyl) cyclohexane, 1,4-bis(hydroxyethyl)cyclohexane, 1,4-bis(hydroxypropyl)cyclohexane, 1,4-bis(hydroxymethoxy)

cyclohexane, 1,4-bis(hydroxyethoxy)cyclohexane, 2,2-bis (4-hydroxymethoxycyclohexyl)propane, 2,2-bis(4-hydroxyethoxycyclohexyl)propane, bis(4-hydroxycyclohexyl)methane, 2,2-bis(4-hydroxycyclohexyl) propane, or 3(4),8(9)-tricyclo[5.2.1.0$^{2,6}$]decanedimethanol, polyether diol such as diethylene glycol, polyethylene glycol, or polytetramethylene glycol, alkylene oxide adduct of bisphenol A, alkylene oxide adduct of bisphenol F, or the like. Also, trivalent or polyvalent polyol such as trimethylol ethane, trimethylol propane, glycerin, pentaerythritol, or polyglycerin may be used in combination. Among these, as the one that lowers the glass transition temperature, alkylene glycol such as 1,5-pentanediol, 1,6-hexanediol, 3-methyl-1, 5-pentanediol, 2-methyl-1,5-pentanediol, 1,9-nonanediol, or 1,10-decanediol is particularly preferable.

It is preferable that the polyester resin does not have a melting point (exhibiting a property of being amorphous) in view of adhesiveness and solvent solubility. The term "does not have a melting point" as used herein means that the resin does not show a definite melting peak in differential scanning calorimetry (DSC) analysis.

The polyurethane resin used as the resin (C) of the present invention is preferably a polyester urethane resin in view of close adhesiveness and humidity resistance. A preferable component of the polyester diol used in synthesizing the polyester urethane resin is the same as the polyester resin that can be compounded as the already described resin (C); however, the number-average molecular weight is preferably 10,000 or higher, and the upper limit is preferably 80,000 or lower, and more preferably 50,000 or lower. The glass transition temperature (Tg) of the polyurethane resin is preferably 20° C. or lower, and more preferably 0° C. or lower. Also, the glass transition temperature is preferably −50° C. or higher. When the glass transition temperature is lower than −50° C., the paste coating film will be soft and the resistance to the plating solution will be poor. Also, when the glass transition temperature is above 20° C., the coating film mixed with vinyl chloride-vinyl acetate resin cannot fully ensure the close adhesion property to the substrate. The polyurethane resin is synthesized by a known method by compounding various polyols, a diisocyanate compound, and, if needed, a chain extending agent. The polyurethane resin can be polymerized in a solution, thereby having a characteristic capable of obtaining those having a higher molecular weight compared to polyester resin, and having a tendency of being able to obtain a high close adhesiveness of the coating film.

The isocyanate compound used in synthesizing the polyurethane resin may be, for example, tetramethylene diisocyanate, hexamethylene diisocyanate, toluene diisocyanate, diphenylmethane-4,4'-diisocyanate, hydrogenated diphenylmethane diisocyanate, xylylene diisocyanate, hydrogenated xylylene diisocyanate, isophorone diisocyanate, or the like.

The resin (C) of the present invention may be any one of a mixture of two or more kinds of polyester resin, a mixture of two or more kinds of polyurethane resin, and a mixture of one kind or two or more kinds of polyester resin and one kind or two or more kinds of polyurethane resin. The sum of the amounts of the resin (C) in the present invention is assumed to refer to a sum of the amounts of the total polyester resins and the total polyurethane resins contained in the conductive paste of the present invention. The sum of the amounts of the resin (C) is 50 to 400 parts by weight, preferably 55 to 300 parts by weight, and further preferably 60 to 250 parts by weight relative to 100 parts by weight of the resin (B). When the sum of the amounts of the resin (C) is less than 50 parts by weight, the close adhesiveness to the substrate tends to decrease, whereas when the sum exceeds 400 parts by weight, the resistance to the plating solution tends to decrease.

The kind of the organic solvent (E) used in the conductive paste of the present invention is not particularly limited, and may be, for example, ester type, ketone type, ether ester type, chlorine type, alcohol type, ether type, hydrocarbon type, or the like. In the case of performing screen printing, a high-boiling-point solvent such as ethylcarbitol acetate, butyl cellosolve acetate, isophorone, cyclohexanone, γ-butyrolactone, DBE (manufactured by Invista Japan Co., Ltd.), N-methyl-2-pyrrolidone, or monoalkyl ether acetate of propylene glycol. A preferable boiling point of the solvent is 130° C. or higher, more preferably 150° C. or higher, and most preferably 180° C. or higher. The upper limit of the boiling point is preferably 250° C. or lower in view of the drying speed.

It is necessary that the conductive paste of the present invention is compounded with blocked isocyanate (D) that has been blocked by an active methylene compound. Accordingly, a cured coating film can be obtained by a heating treatment at a relatively low temperature. In a preferable embodiment, a cured coating film capable of withstanding a high-temperature and highly alkaline non-electrolytic plating process can be obtained by a heating treatment at 80° C. and for 30 minutes. A preferable amount of compounding the blocked isocyanate (D) is 1 to 40 parts by weight relative to 100 parts by weight of the sum of the amounts of the resin (B) and the resin (C).

The isocyanate compound that is blocked by an active methylene compound may be, for example, aromatic, aliphatic, alicyclic diisocyanate, or trivalent or polyvalent polyisocyanate, and may be either a low-molecular-weight compound or a high-molecular-weight compound. For example, it may be a terminal isocyanate group-containing organic compound obtained by allowing tetramethylene diisocyanate, hexamethylene diisocyanate, toluene diisocyanate, diphenylmethane diisocyanate, hydrogenated diphenylmethane diisocyanate, xylylene diisocyanate, hydrogenated xylylene diisocyanate, isophorone diisocyanate, or a trimer of these isocyanate compounds and an excessive amount of these isocyanate compounds to react with a low-molecular-weight active hydrogen compound such as ethylene glycol, propylene glycol, trimethylolpropane, glycerine, sorbitol, ethylene diamine, monoethanolamine, diethanolamine, or triethanolamine or a high-molecular-weight active hydrogen compound of various polyester polyols, polyether polyols, and polyamides. The isocyanate compound is preferably toluene diisocyanate, diphenylmethane diisocyanate, isophorone diisocyanate, hexamethylene diisocyanate or a derivative thereof in view of the resistance to plating solution.

The active methylene compound used as an agent for forming blocked isocyanate may be, for example, malonic acid dialkyl esters, acetoacetic acid esters such as methyl acetoacetate or ethyl acetoacetate, β-diketones such as acetylacetone, or the like, or may be a mixture of these. The alkyl group in the malonic acid dialkyl esters may be, for example, methyl, ethyl, isopropyl, n-butyl, iso-butyl, sec-butyl, tert-butyl, 2-ethylhexyl or the like, and the two alkyl groups may be the same or different.

A specific example of the blocked isocyanate (D) may be, for example, Duranate K-6000, MF-K60X manufactured by Asahi Kasei Chemicals Co., Ltd.

Into the conductive paste of the present invention, a curing catalyst other than an isocyanate compound may be compounded. As the curing catalyst, it is preferable to use a tin-type compound in view of the curability. The tin-type compound may be, for example, dibutyltin diacetate, dibutyltin dilaurate, dibutyltin mercaptide, dibutyltin thiocarboxylate, dibutyltin dimaleate, dioctyltin mercaptide, dioctyltin thiocarboxylate, or the like.

A curing catalyst other than the tin-type compound may be, for example, bismuth-type compound such as bismuth-2-ethyl hexanoate or bismuth neodecanoate, zinc-type compound such as zinc neodecanoate, monoamine such as triethylamine or N,N-dimethylcyclohexylamine, diamine such as N,N,N',N'-tetramethylethylenediamine, N,N,N',N'-tetramethylpropane-1,3-diamine, or N,N,N',N'-tetramethylhexane-1,6-diamine, triamine such as N,N,N',N'',N''-pentamethyldiethylenetriamine, N,N,N',N'',N''-pentamethyldipropylenetriamine, or tetramethylguanidine, cyclic amine such as triethylenediamine, N,N'-dimethyl piperazine, N-methyl-N'-(2-dimethylamino)ethylpiperazine, N-methylformalin, N—(N',N'-dimethylaminoethyl)-morpholine, or 1,2-dimethylimidazole, alcohol amine such as dimethylaminoethanol, dimethylaminoethoxyethanol, N,N,N'-trimethylaminoethylethanolamine, N-methyl-N'-(2-hydroxyethyl)-piperazine, or N-(2-hydroxyethyl)morpholine, ether amine such as bis(2-dimethylaminoethyl)ether, ethylene glycol bis(3-dimethyl)-aminopropyl ether, or the like.

Regarding the amount of compounding the curing catalyst, the lower limit is preferably 0.05 wt % or more, and more preferably 0.2 wt % or more relative to the resin (B) in view of the curability, and the upper limit is preferably 5 wt % or less, and more preferably 3 wt % or less in view of the problem of decrease in the coating film physical property such as conductivity.

A sum of the amounts of the resin (B), the resin (C) component, and the blocked isocyanate (D) is 10 to 60 parts by weight, more preferably 15 to 45 parts by weight, and further preferably 20 to 40 parts by weight relative to 100 parts by weight of the conductive powder (A). When the sum is less than 10 parts by weight, the close adhesiveness to the substrate tends to be considerably aggravated, whereas when the sum exceeds 60 parts by weight, the close adhesiveness at the boundary between the paste and the plating tends to be aggravated after the plating is carried out.

The conductive paste of the present invention is preferably such that the gel fraction ratio of a soluble solid component within the conductive paste when a heating treatment at 80° C. and for 30 minutes is applied to the soluble solid component is 40% or more, more preferably 55% or more, and further preferably 70% or more. The upper limit of the gel fraction ratio is preferably 100% or less. When the gel fraction ratio is too low, the close adhesiveness of the coating film after non-electrolytic plating tends to be inferior. Here, in the process of manufacturing a coating film and an electric wiring, the treatment is not limited to a heating treatment at 80° C. and for 30 minutes, so that the temperature may be lower than or higher than 80° C., and the heating time may be more than or less than 30 minutes.

To the conductive paste of the present invention, a known additive such as defoaming agent, leveling agent, dispersing agent, or coupling agent is preferably added.

The defoaming agent may be, for example, a known one such as silicone resin, silicone solution, special foam-breaking agent that does not contain silicone, acrylic acid alkyl ester copolymer, methacrylic acid alkyl ester copolymer, alkyl vinyl ether, acrylic copolymer, foam-breaking polymer, polysiloxane, foam-breaking polysiloxane, polymethylalkylsiloxane, polyether denatured polysiloxane, or paraffin mineral oil. A preferable upper limit of the amount of addition of the defoaming agent is 2 wt % relative to the paste, and the lower limit is 0.05 wt %. When the amount is less than 0.05 wt %, the effect as a defoaming agent may not be obtained, whereas when the amount exceeds 2 wt %, the effect is saturated. This not only is uneconomical but also may possibly cause decrease in the close adhesiveness or the aggravation of the anti-blocking property.

The leveling agent may be, for example, polyether denatured polydimethylsiloxane, polyester denatured polydimethylsiloxane, polyester denatured methylalkylpolysiloxane, polyether denatured polymethylalkylsiloxane, aralkyl denatured polymethylalkylsiloxane, polyester denatured hydroxyl group-containing polydimethylsiloxane, polyetherester denatured hydroxyl group-containing polydimethylsiloxane, acrylic copolymer, methacrylic copolymer, polyether denatured polymethylalkylsiloxane, acrylic acid alkyl ester copolymer, methacrylic acid alkyl ester copolymer, acrylic acid, acrylic acid alkyl copolymer, a graft copolymer of polyoxyalkylenemonoalkyl or alkenyl ether, or lecithin. A preferable upper limit of the amount of addition of the leveling agent is 2 wt % relative to the paste, and the lower limit is 0.05 wt %. When the amount is less than 0.05 wt %, the effect as a leveling agent may not be obtained, whereas when the amount exceeds 2 wt %, the effect is saturated. This not only is uneconomical but also may possibly cause decrease in the close adhesiveness or the aggravation of the anti-blocking property.

As the dispersing agent, it is possible to use a commercially available one such as long-chain polyamide type, phosphoric acid salt of long-chain polyamide, polyamide type, unsaturated polycarboxylic acid, or tertiary amino group containing polymer. A preferable upper limit of the amount of addition of the dispersing agent is 2 wt % relative to the paste, and the lower limit is 0.05 wt %. When the amount is less than 0.05 wt %, the effect as a dispersing agent may not be obtained, whereas when the amount exceeds 2 wt %, the effect is saturated. This not only is uneconomical but also may possibly cause decrease in the close adhesiveness or the aggravation of the anti-blocking property.

As the coupling agent, it is possible to use a commercially available one such as aluminum type coupling agent such as alkyl acetoacetate aluminum diisopropylate, acylate, phosphate, alcoholate, or a titanate coupling agent of coordinate type. A preferable upper limit of the amount of addition of the coupling agent is 5 wt % relative to the paste, and the lower limit is 0.05 wt %. When the amount is less than 0.05 wt %, the effect as a coupling agent may not be obtained, whereas when the amount exceeds 5 wt %, the effect is saturated. This not only is uneconomical but also may possibly cause decrease in the close adhesiveness or the aggravation of the anti-blocking property.

An electric wiring can be formed by forming a coating film made of the conductive paste of the present invention on an insulating substrate. The material of the insulating substrate on which the electric wiring is formed is not particularly limited; however, an insulating substrate having a low heat resistance such as PC (polycarbonate), ABS (acrylonitrile•butadiene•styrene), or PPE (polyphenylene ether) is preferable. This is because these insulating substrates are inexpensive and are excellent in molding processability and shock resistance. Also, the heat resistance as referred to herein is evaluated on the basis of the load deflection temperature, and a material having a high load deflection temperature is assumed to be a material having a high heat resistance, whereas a material having a low load deflection temperature is assumed to be a material having a low heat resistance. The load deflection temperature is determined by the temperature (unit: ° C.) at which the magnitude of the deflection attains a constant value while the temperature of the sample is being raised in a state in which a load determined by the standard of an industrial testing method is given. Here, the industrial testing method may be, for example, JIS or ASTM. The PC is a thermoplastic plastic produced by using bisphenol A and phosgene (or diphenyl carbonate) as source materials. In the present invention, for example, the PC (trade name: Iupilon (registered trademark) grade S-3000R) manufactured by Mitsubishi Engineering Plastic Co., Ltd. can be used, and the load deflection temperature thereof is 123° C. The ABS is made of a copolymerized synthesized resin of acrylonitrile, butadiene, and styrene. In the present invention, for example, the ABS (trade name: Toyolac (registered trademark) grade 250) manufactured by Toray Co., Ltd. can be used, and the load deflection temperature thereof is 87° C. The PPE is a thermoplastic resin having an aromatic polyether structure, and is mainly made into an alloy with other synthesized resins such as shock-resistant polystyrene to be used as denatured polyphenylene ether m-PPE. In the present invention, for example, the PPE (trade name: Iupiace (registered trademark) grade TX430) manufactured by Mitsubishi Engineering Plastic Co., Ltd. can be used, and the load deflection temperature thereof is 92° C. Insulating substrates having a low heat resistance such as these PC, ABS, and PPE are inexpensive materials, and are excellent in molding processability and shock resistance. With a conventional conductive paste, a coating film must be formed by performing a treatment at a high temperature in order to form an electric wiring or the like, so that the insulating substrates having a low heat resistance such as PC, ABS, and PPE could not be used. In contrast, with use of the conductive paste of the present invention, the coating film can be formed at a low temperature, so that an electric wiring can be formed on an insulating substrate being inexpensive and being excellent in molding processability and shock resistance such as PC, ABS, or PPE. Also, in the present invention, the insulating substrate may be a mixture or an alloy of a plurality of resins, or may be one mixed with an insulating filler.

The electric wiring of the present invention can be produced by a method of printing and/or applying a conductive paste on an insulating substrate such as a resin housing molded by ordinary injection molding, drying and curing the conductive paste by a heating treatment, and performing non-electrolytic plating or electrolytic plating in accordance with the needs so as to form a conductive layer. Such a method enables mass production of electric wirings in a simple manner and at a low cost.

Figure 2:
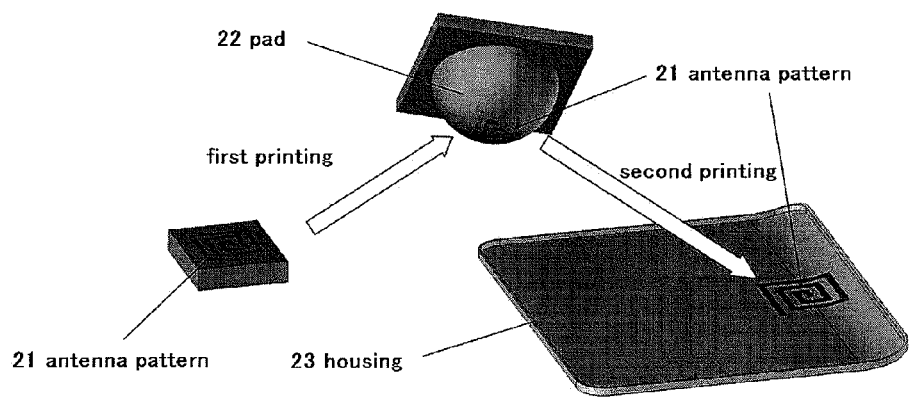
FIG. 2 is a schematic view of one example of a pad printing process according to an embodiment of the present invention.

The method of printing and/or applying the conductive paste may be various printing and applying methods such as pad printing, screen printing, ink jet printing, dispenser application, dot dispenser application, and spray coating application. In particular, the pad printing method has advantages such that printing can be made on a curved surface of a housing with ease and, in the case of change in the circuit design, it can meet the change simply by modifying the template used in the pad printing, thereby providing a high degree of freedom in designing. Therefore, the pad printing method is an especially preferable printing method in the production of electrical wirings of the present invention. Also, in the case of adopting the pad printing method, the material of the pad is not particularly limited; however, a suitable example of the material is silicone rubber. One example of the process of forming an antenna pattern 11 shown in FIG. 1 by pad printing is shown in FIG. 2. Here, first, a (desired) antenna pattern 21 made of the conductive paste is prepared, and then this antenna pattern 21 is printed (first printing) on the convex part of the pad 22, and thereafter the antenna pattern 21 on the convex part of the pad 22 is printed (second printing) at a predetermined position on an insulating substrate 23 such as a housing.

The method of drying and curing the printed conductive paste is not particularly limited; however, it can be carried out by known means such as a box oven or a conveyor furnace. Also, as a supply source of heat, known means can be adopted such as electric heating wire, hot air circulation, or an infrared lamp. The heating temperature and the heating time are not particularly limited; however, they must be determined by considering not only the curability of the conductive paste but also the heat resistance of the insulating substrate. In order to take advantage of the low-temperature curing property of the conductive paste of the present invention, it is preferable to carry out a heating treatment at 60 to 100° C. A preferable condition for the heating treatment may be, for example, a keep time of 3 minutes at 80° C. or a keep time of 10 minutes at 70° C. in a conveyor type IR furnace, or a keep time of 30 minutes at 80° C. or a keep time of 60 minutes at 70° C. in a hot air circulation type conveyor furnace.

Figure 3:
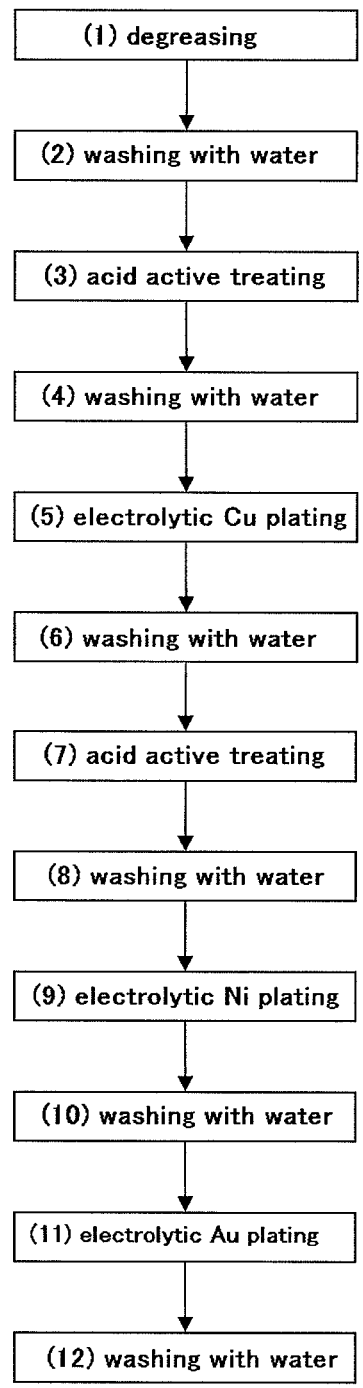
FIG. 3 is a flow diagram showing one example of an electrolytic plating process according to an embodiment of the present invention.
Figure 4:
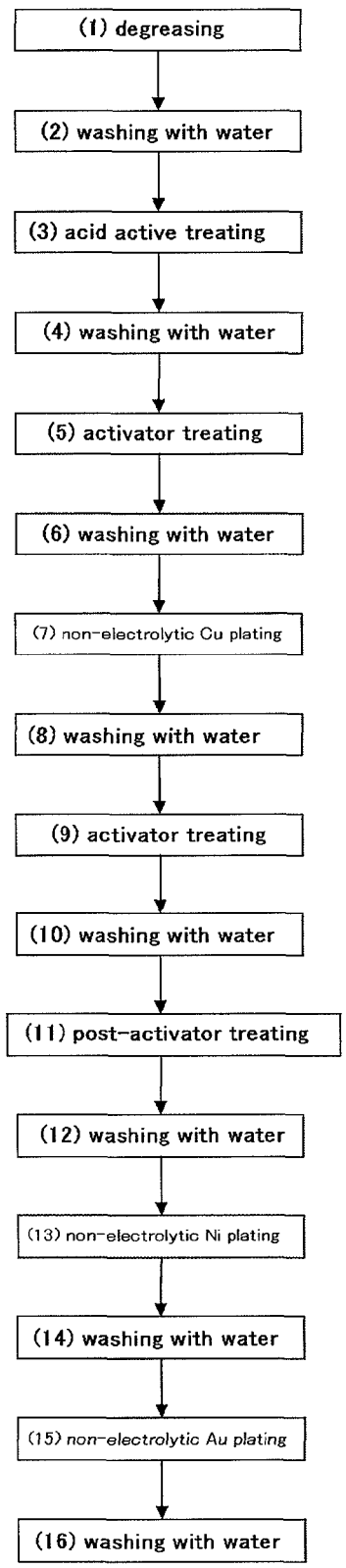
FIG. 4 is a flow diagram showing one example of a non-electrolytic plating process according to an embodiment of the present invention.

The electric wiring in which a conductive paste coating film is formed on an insulating substrate is preferably further subjected to a plating process. The plated layer may be formed by electrolytic plating alone, by non-electrolytic plating alone, or by a process in which electrolytic plating and non-electrolytic plating are combined. One example of the electrolytic plating process is shown in FIG. 3, and one example of the non-electrolytic plating process is shown in FIG. 4. The electrolytic plating process shown in FIG. 3 is carried out in the order from (1) through to (12).

(1) An object of plating is immersed into a degreasing liquid, so as to perform degreasing.

(2) Next, the resultant is washed with cleaning water.

(3) Next, in order to remove oxide film of the conductive powder contained in the conductive paste of the present invention, the resultant is immersed into an acid active treating solution.

(4) Next, the resultant is washed with cleaning water.

(5) Next, the resultant is immersed into an electrolytic Cu plating solution, and an electric current is applied to the conductive paste layer serving as an object of plating, so as to deposit Cu.

(6) Next, the resultant is washed with cleaning water.

(7) Next, in order to remove oxide film of the Cu plated film, the resultant is immersed into an acid active treating solution.

(8) Next, the resultant is washed with cleaning water.

(9) Next, the resultant is immersed into an electrolytic Ni plating solution, and an electric current is applied to the Cu plated layer, so as to deposit Ni.

(10) Next, the resultant is washed with cleaning water.

(11) Next, the resultant is immersed into an electrolytic Au plating solution, and an electric current is applied to the Ni plated layer, so as to deposit Au.

(12) Next, the resultant is washed with cleaning water.

Also, the non-electrolytic plating process shown in FIG. 4 is carried out in the order from (1) through to (16).

(1) An object of plating is immersed into a degreasing liquid, so as to perform degreasing.

(2) Next, the resultant is washed with cleaning water.

(3) Next, in order to remove oxide film of the conductive powder contained in the conductive paste of the present invention, the resultant is immersed into an acid active treating solution.

(4) Next, the resultant is washed with cleaning water.

(5) Next, the resultant is immersed into a catalyst imparting treating solution in order to impart a catalyst.

(6) Next, the resultant is washed with cleaning water.

(7) Next, the resultant is immersed into a non-electrolytic Cu plating solution to deposit Cu.

(8) Next, the resultant is washed with cleaning water.

(9) Next, the resultant is immersed into a catalyst imparting treating solution in order to impart a catalyst.

(10) Next, the resultant is washed with cleaning water.

(11) Next, in order to prevent deposition outside of the pattern, the resultant is immersed into a post-activator treating solution to remove the catalyst adhering to the outside of the pattern.

(12) Next, the resultant is washed with cleaning water.

(13) Next, the resultant is immersed into a non-electrolytic Ni plating solution to deposit Ni.

(14) Next, the resultant is washed with cleaning water.

(15) Next, the resultant is immersed into a non-electrolytic Au plating solution to deposit Au.

(16) Next, the resultant is washed with cleaning water.

Figure 5:
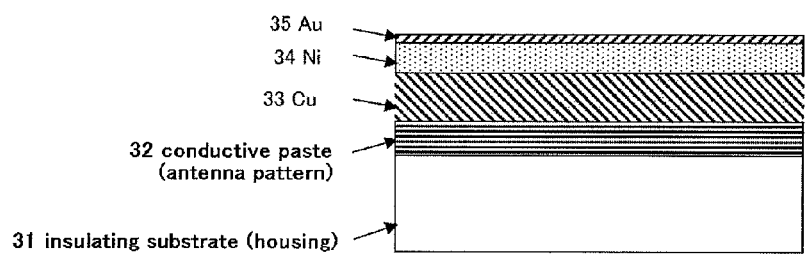
FIG. 5 is a schematic view showing one example of a cross section of a conductive layer according to an embodiment of the present invention.

The construction of the plated layer that is formed by performing electrolytic plating and non-electrolytic plating is not particularly limited; however, the construction of FIG. 5 can be mentioned as a preferable example of the case of forming particularly the plated layer as an antenna circuit. In FIG. 5, on an insulating substrate 31 serving as a housing, first a coating film 32 formed from the conductive paste and subsequently each film of Cu 33, Ni 34, and Au 35 are sequentially formed, so as to form a plated layer made of three films. A preferable example of the construction of the plated layer may further be Cu, Ni/Cu/Ni, and Ni/Cu/Ni/Au. Also, the film thickness of each layer is not particularly limited.

The electric wiring of the present invention can be used as an electric circuit, an antenna circuit, a sensor circuit, an electromagnetic shield, a contact point, a heat conduction member, or the like. The apparatus of the present invention can be mounted on mobile apparatus such as a personal computer, a portable telephone, a fixed telephone, and a PDA, audio apparatus such as a television set and an audio player, information terminal apparatus such as an IC card, an IC tag, and an information management terminal on the point of sale, and home-use electric appliances such as a cleaner, a refrigerator, an electric rice-cooker, and an air conditioner. Also, since the electric wiring can be formed along a curved shape, it can contribute to an improvement in the volume efficiency of these without hindering the degree of freedom in designing.

EXAMPLES

The present invention will now be illustrated by using the following Examples although the present invention is not limited thereto. The term "part(s)" used in the Examples is one by weight. Also, each measurement item in the Examples is performed as follows.

1. Resin Composition

The resin was dissolved into chloroform-d, and 1H-NMR analysis was carried out using nuclear magnetic resonance analyzer (NMR) Gemini-200 manufactured by Valian Co., Ltd. and the resin composition was determined by the integrated ratio thereof.

2. Reduced Viscosity of Polyester Resin and Polyurethane Resin

Measurement was carried out at 30° C. by using an Ubbellohde viscometer after dissolving 0.10 g of the sample into 25 ml of mixed solvent of phenol/tetrachloroethane (weight ratio=6/4). The unit is denoted by dl/g.

3. Number-Average Molecular Weight

By using a gel filtration permeation chromatograph (GPC) 150c manufactured by Waters Co., Ltd. using tetrahydrofuran as a moving phase, GPC measurement was carried out with a column temperature of 30° C. and a flow rate of 1 ml/min. By calculating from the result thereof, a measurement value as converted in terms of polystyrene was obtained. Here, the column that was put to use was shodex KF-802, 804, 806 manufactured by Showa Denko Co., Ltd.

4. Glass Transition Temperature (Tg)

With use of a differential scanning calorimeter (DSC), measurement was carried out at a temperature raising speed of 20° C./min. As a sample, 5 mg of the sample was put into an aluminum pressing lid type container, and climped.

5. Acid Value (mgKOH/g)

The sample (0.2 g) was precisely weighed, and was dissolved into 20 ml of chloroform. Subsequently, titration was carried out with use of potassium hydroxide (ethanol solution) of 0.01N, so as to determine the acid value. As an indicator, phenolphthalein was used.

6. Hydroxyl Value (mgKOH/g)

Into 120 g of 2-butanone, 50 g of the resin was dissolved, and 50 g of diphenylmethane-4,4'-diisocyanate was added, so as to carry out reaction at 80° C. for 2 hours. Subsequently, the residual isocyanate group concentration in the reaction liquid was quantitated by titration, and the result was converted into a hydroxyl value assuming that the amount of consumed isocyanate is the amount of hydroxyl group contained in the resin.

7. Viscosity of the Paste

The viscosity of the conductive paste was measured with use of a Brookfield viscometer HBDV type at a rotation speed of 20 rpm at 25° C.

8. Formation of a Test Piece

The conductive paste was screen-printed on an insulating substrate made of PET film having a thickness of 100 μm and treated by annealing (150° C., 2 hours) into a pattern having a width of 350 mm and a length of 450 mm (for heat resistance measurement, humidity resistance measurement, and heat shock resistance property) and into a pattern having a width of 25 mm and a length of 50 mm (for specific resistance measurement) so that the film thickness after drying would be 8 to 15 μm. This was dried in a box oven under a condition at 80° C. and for 30 minutes, thereby to form a test piece.

9. Specific Resistance

The test piece prepared in 8. was mounted on a self-made electrode so that the printed surface would be on the electrode side, and was pressed with use of a clip for office use. Next, in the case of silver paste, the upper part of the electrode was connected to a four-probe resistance measurement device (milliohm meter 4328A type manufactured by Yokokawa Hewlett Packard Co., Ltd.) with an alligator clip and a copper wire, so as to measure the sheet resistance. Separately, the film thickness was measured with use of a digital film thickness meter, and a specific resistance was calculated from these. The specific resistance was calculated based on the following formula, and the unit was represented by Ω·cm. Specific resistance (Ω·cm)=sheet resistance (Ω)×film thickness (cm)

10. Heat Resistance

After the test piece prepared in 8. was thermally treated in a hot air oven at 60° C. for 500 hours, the close adhesiveness and the pencil hardness of the conductor were evaluated.

11. Humidity Resistance

After the test piece prepared in 8. was thermally treated in a thermohygrostat at 60° C. with a relative humidity of 95%

RH for 500 hours, the close adhesiveness and the pencil hardness of the conductor were evaluated.

12. Heat Shock Resistance

The test piece prepared in 8. was left to stand in environments of −40° C. and 70° C. each alternately for one hour with use of a heat shock tester. After the test piece was left to stand for a sum of 500 hours, the close adhesiveness and the pencil hardness of the conductor were evaluated.

13. Coldness Resistance

After the test piece prepared in 8. was left to stand at −40° C. for 500 hours, the close adhesiveness and the pencil hardness of the conductor were evaluated.

14. Close Adhesiveness

With use of the test piece prepared in 8., the close adhesion property was evaluated by a checker board cellotape (registered trademark) exfoliation test according to JIS K-5600-5-6: 1991. Here, the number of cuts in each direction of the lattice pattern was set to be 11, and the cutting interval was set to be 1 mm. The notation of 100/100 shows that there was no exfoliation and the close adhesiveness is good, whereas the notation of 0/100 represents that the whole was exfoliated.

15. Pencil Hardness

The test piece prepared in 8. was put on an SUS304 plate having a thickness of 2 mm, and measurement was made according to JIS K 5600-5-4: 1999. Determination was made by the presence or absence of exfoliation.

16. Gel Fraction Ratio

The gel fraction ratio within the soluble solid component in the conductive paste was determined as follows. The paste was filtered with use of a filter paper 5th-kind A and a coating film was formed on a polypropylene film (having a dried film thickness of 8 to 10 μm) with use of the filtrate. The coating film was exfoliated after a treatment at 80° C. and for 30 minutes, so as to measure the weight thereof (this weight is assumed to be W1). This was dissolved into a solution of toluene/2-butanone=50/50 parts by weight, and the unsolved fraction was separated to measure the weight thereof (this weight is assumed to be W2). The gel fraction ratio within the soluble solid component was calculated as being W2/W1.

17. Evaluation of Electrolytic Plating Property

As a pseudo electrolytic plating solution, an aqueous solution of sulfuric acid with pH 1 was used, and the test piece prepared in 8. was dipped at 25° C. for 4 hours, so as to measure whether there is no change in the close adhesiveness and the pencil hardness of the paste from those of the initial one. Determination was made by the presence or absence of the change.

18. Evaluation of Non-Electrolytic Plating Property

As a pseudo electrolytic plating solution, an aqueous solution of sodium hydroxide with pH 12.5 was used, and the test piece prepared in 8. was dipped at 70° C. for 2 hours, so as to measure whether there is no change in the close adhesiveness and the pencil hardness of the paste from those of the initial one. Determination was made by the presence or absence of the change.

19. Evaluation of Close Adhesiveness after Electrolytic Plating

The test piece prepared in 8. was subjected to electrolytic plating, and the fabricated circuit was subjected to measurement of close adhesiveness by the method of 14. Evaluation was made by an exfoliation test. Similarly, this circuit was exposed to the environment test of 10 to 13, and the close adhesiveness test was carried out by the method of 14. to perform evaluation.

20. Evaluation of Close Adhesiveness after Non-Electrolytic Plating

The test piece prepared in 8. was subjected to non-electrolytic plating, and the fabricated circuit was subjected to measurement of close adhesiveness by the method of 14. Evaluation was made by an exfoliation test. Similarly, this circuit was exposed to the environment test of 10 to 13, and the close adhesiveness test was carried out by the method of 14. to perform evaluation.

Synthesis Example 1

Synthesis of Polyester Resin I

In the known polyester polymerization method, a reaction vessel was loaded with 238 parts by weight of terephthalic acid dimethyl ester, 238 parts by weight of isophthalic acid dimethyl ester, 9.6 parts by weight of trimellitic anhydride, 186 parts by weight of ethylene glycol, 208 parts by weight of 2,2-dimethyl-1,3-propanediol, and 0.17 part by weight of tetrabutyl titanate, and an ester exchange reaction was carried out at 180° C. to 230° C. for 8 hours. Subsequently, the pressure of this reaction system was reduced to 5 mmHg in 30 minutes, and the temperature was raised to 250° C. during this process. Further, a condensation polymerization reaction was carried out under 0.3 mmHg and at 250° C. for 30 minutes. The reduced viscosity of the obtained polyester was 0.61 dl/g. Next, nitrogen gas was introduced to this reaction system, and the reaction vessel was loaded with 399 parts by weight of ε-caprolactone. After the reaction system was homogenized, the resultant was heated at 220° C. for 2 hours, so as to obtain a copolymerized polyester. The composition of the obtained polyester resin was determined as terephthalic acid/isophthalic acid/trimellitic acid//ethylene glycol/neopentyl glycol//ε-caprolactone=49/49/2//55/45//140 (molar ratio) by 1H-NMR measurement. Also, the reduced viscosity was 1.2 dl/g; the number-average molecular weight was 30,000; the acid value was 0.7 mgKOH/g; and the glass transition temperature was −18° C. The composition and the physical properties of the polyester resin I are shown in Table 1.

Synthesis Examples 2 to 5

Synthesis of Polyester Resins II to V

Polyester resins II to V were synthesized in the same manner as in the synthesis example 1. The composition and the physical properties of the polyester resins II to V are shown in Table 1.

Synthesis Example 6

Synthesis of Polyester Diol a

A reaction vessel equipped with a thermometer, a stirrer, and a Liebig cooling tube was loaded with 97 parts by weight of terephthalic acid dimethyl ester, 97 parts by weight of isophthalic acid dimethyl ester, 82 parts by weight of ethylene glycol, and 92 parts by weight of 2,2-dimethyl-1,3-propanediol, and further, 0.1 part by weight of tetrabutoxy titanate was added as a catalyst. The reaction was carried out under an ordinary pressure at 240° C. for about 4 hours, and the produced water was removed by distillation. Subsequently, the pressure was reduced at 245° C. for about 10 minutes, so as to end the reaction. The composition ratio (molar ratio) of the obtained polyesterdiol (a) was determined as terephthalic acid/isophthalic acid/ethylene glycol//2,2-dimethyl-1,3-propanediol=50/50//43/57, and the hydroxyl value was 62 mgKOH/g. The composition and the physical properties of the polyester diol a are shown in Table 2.

Synthesis Examples 7 and 8

Synthesis of Polyester Diols b and c

Polyester diols b and c were synthesized in the same manner as in the synthesis example 1. The composition and the physical properties of the polyester diols b and c are shown in Table 2.

Synthesis Example 9

Synthesis of Polyurethane Resin I

To 133 parts by weight of methyl ethyl ketone (hereafter referred to as MEK) and 133 parts by weight of toluene (hereafter referred to as TOL), 100 parts by weight of polyesterpolyol (a) sufficiently dried in advance, 150 parts by weight of ODX-688 (aliphatic polyester diol, number-average molecular weight of 2000, manufactured by Dainippon Ink Chemical Industry Co., Ltd.) and 5 parts by weight of 1,6-hexanediol were added. Further, 75 parts by weight of 4,4'-diphenylmethanediisocyanate and 0.1 part by weight of dibutyltin dilaurylate as a catalyst were added, and reaction was carried out at 80° C. for 4 hours. Subsequently, the solution was diluted with MEK: 504 parts by weight, so as to obtain a polyurethane resin I. The composition and the physical properties of the polyurethane resin I are shown in Table 3.

Synthesis Examples 10 and 11

Synthesis of Polyurethane Resins II to IV

Polyurethane resins II to IV were synthesized in the same manner as in the synthesis example 1. The composition and the physical properties of the polyurethane resins II to IV are shown in Table 3.

Vinyl Chloride-Vinyl Acetate Resin I

VAGH manufactured by Union Carbide Co., Ltd. (vinyl chloride/vinyl acetate/vinyl alcohol copolymer, number-average molecular weight of 27,000, glass transition temperature of 79° C., acid value of 0 mgKOH/g, and a hydroxyl value of 76 KOHmg/g) was used as it was.

Vinyl Chloride-Vinyl Acetate Resin II

Solbine TAO manufactured by Nisshin Chemical Industry Co., Ltd. (vinyl chloride/vinyl acetate/vinyl alcohol copolymer, number-average molecular weight of 15,000, glass transition temperature of 77° C., acid value of 0 mgKOH/g, and a hydroxyl value of 97.5 KOHmg/g) was used as it was.

Vinyl Chloride-Vinyl Acetate Resin III

Solbine CN manufactured by Nisshin Chemical Industry Co., Ltd. (vinyl chloride/vinyl acetate copolymer, number-average molecular weight of 42,000, glass transition temperature of 75° C., acid value of 0 mgKOH/g, and a hydroxyl value of 0 mgKOH/g) was used as it was.

Curing Agent I

Hexamethylenediisocyanate type blocked diisocyanate blocked with malonic acid dialkyl ester (Duranate K-6000 manufactured by Asahi Chemicals Co., Ltd., number-average molecular weight of 1300) was used as it was.

Curing Agent II

Hexamethylenediisocyanate type blocked diisocyanate blocked with malonic acid dialkyl ester (Duranate MF-K60X manufactured by Asahi Chemicals Co., Ltd., number-average molecular weight of 2000) was used as it was.

Curing Agent III

Hexamethylenediisocyanate type blocked diisocyanate blocked with oxime (Duranate MF-B60X manufactured by Asahi Chemicals Co., Ltd.) was used as it was.

Conductive Powder A

Dendrite silver powder (Sylvest E-20 manufactured by Tokuriki Chemical Institute, average particle size: 9.4 μm, tap density 0.79 g/cm$^3$, specific surface area: 1.7 m$^2$/g) was used as it was.

Conductive Powder B

Flaky silver powder (Silcoat AgC-A manufactured by Fukuda Metal Foil & Powder Co., LTD., average particle size: 4.7 μm, tap density 3.2 g/cm$^3$, specific surface area: 0.82 m$^2$/g) was used as it was.

Example 1

A mixture of conductive powder A (56.0 parts by weight), polyester resin I (8.2 parts by weight), vinyl chloride-vinyl acetate resin I (3.4 parts by weight), curing agent I (4.5 parts by weight), and organic solvent was passed through a chilled three-roll kneader to perform dispersion. The obtained silver paste was printed, dried, and evaluated by the method described in the above 8. Even by a heat treating condition with a relatively low temperature of 80° C. and a short period of time of 30 minutes in an oven, the coating film had a good physical property with a specific resistance of $4.0 \times 10^{-4}$ Ω·cm, a close adhesiveness of 100/100, and a pencil hardness of HB. Also, the plating property was good. After an environment load was given, the coating film exhibited almost the same good physical property as the initial characteristics regarding heat resistance, humidity resistance, heat shock resistance, and coldness resistance. The compounding, the paste characteristics, and the coating film physical property of Example 1 are shown in Table 4.

Examples 2 to 9

Silver pastes of Examples 2 to 9 were prepared in the same manner as in Example 1, and printed, dried, and evaluated by the method described in the above 8. The compounding, the paste characteristics, and the coating film physical property of Examples 2 to 9 are shown in Table 4. In each of the Examples, even by a heat treating condition with a relatively low temperature of 80° C. and a short period of time of 30 minutes in an oven, the coating film had a good physical property.

Comparative Examples 1 to 8

Silver pastes of Comparative Examples 1 to 8 were prepared in the same manner as in Example 1, and printed, dried, and evaluated by the method described in the above 8. The compounding, the paste characteristics, and the coating film physical property of Comparative Examples 1 to 8 are shown in Table 5. Comparative Example 1 is an example in which vinyl chloride-vinyl acetate resin is not used, and blocked isocyanate blocked with oxime is used as a curing agent. Comparative Example 2 is an example in which flaky silver powder is used; vinyl chloride-vinyl acetate resin is not used; and blocked isocyanate blocked with oxime is used as a curing agent. Comparative Example 3 is an example in which flaky silver powder is used, and a curing agent is not used. Comparative Examples 4 and 5 are respective examples in which a high-Tg polyester resin and a high-Tg polyurethane resin are used. Comparative Example 6 is an example in which flaky silver powder is used, and the amount of the conductive powder is extremely small. In Comparative Examples 1 to 6, in each case, the coating film was inferior in humidity resistance after electrolytic plating, and a good coating film physical property was not obtained after non-electrolytic plating. Comparative Example 7 is an example in which the curing agent was changed to blocked isocyadnate blocked with oxime in Example 1; however, the coating film was inferior in the close adhesiveness after the environment load test both after electrolytic plating and after non-electrolytic plating. Comparative Example 8 is an example in which vinyl chloride-vinyl acetate resin is not used; a high-Tg polyester resin is used; and blocked isocyanate blocked with oxime is used as a curing agent. In Comparative Example 8 also, the coating film was inferior in humidity resistance after electrolytic plating, and a good coating film physical property was not obtained after non-electrolytic plating.

Examples 10 to 12

Examples 10 to 12 were carried out in the same manner as in Example 1 except that the compounding of the paste was changed as described in Table 6, and that the insulating substrate was changed to a polycarbonate/ABS resin substrate having a thickness of 500 μm. In each of the Examples 10 to 12, even by a heat treating condition with a relatively low temperature of 80° C. and a short period of time of 30 minutes in an oven, the coating film had a good physical property. The compounding, the paste characteristics, and the coating film physical property of Examples 10 to 12 are shown in Table 6.

Comparative Examples 9 to 11

Comparative Examples 9 to 11 were carried out in the same manner as in Example 1 except that the compounding of the paste was changed as described in Table 6, and that the insulating substrate was changed to a polycarbonate/ABS resin substrate having a thickness of 500 μm. The compounding, the paste characteristics, and the coating film physical property of Comparative Examples 9 to 11 are shown in Table 6. Comparative Example 9 is an example in which a high-Tg polyester resin is used, and a curing agent is not used. Comparative Example 10 is an example in which a high-Tg polyester resin is used. Comparative Example 11 is an example in which a high-Tg polyurethane resin is used. In each of the Comparative Examples 9 to 11, the coating film was inferior in humidity resistance after electrolytic plating, and a good coating film physical property was not obtained after non-electrolytic plating.

TABLE 2

|  |  |  | Polyester diol | | |
|---|---|---|---|---|---|
|  |  |  | a | b | c |
| Composition ratio (molar ratio) | dibasic acid | DMT | 50 | 48 | 50 |
|  |  | DMI | 50 | 48 | 50 |
|  |  | DSN |  | 4 |  |
|  | glycol | EG | 43 | 38 | 50 |
|  |  | 2MG |  | 62 |  |
|  |  | NPG | 57 |  | 50 |
| Physical properties | hydroxyl value (mgKOH/g) |  | 62 | 113 | 62 |

DMT: terephthalic acid dimethyl ester
DMI: isophthalic acid dimethyl ester
DSN: 5-sodium sulfo isophthalic acid dimethyl ester
EG: ethylene glycol
2MG: 2-methyl-1,3-propanediol
NPG: 2,2-dimethyl-1,3-propanediol

TABLE 3

|  |  |  | Polyurethane resin | | | |
|---|---|---|---|---|---|---|
|  |  |  | I | II | III | IV |
| Composition ratio (weight ratio) | diol | polyester diol (a) | 100 |  |  |  |
|  |  | polyester diol (b) |  | 100 |  |  |
|  |  | polyester diol (c) |  |  | 100 |  |
|  |  | ODX688 | 150 | 100 |  | 100 |
|  |  | NPG |  | 8 |  | 6 |
|  |  | HD | 5 |  |  | 2 |
|  |  | PLACCEL 220 |  | 30 |  |  |
|  | isocyanate | MDI | 75 | 49 | 75 | 31 |
| Physical properties |  | number-average molecular weight (×10³) | 25 | 30 | 23 | 38 |
|  |  | glass transition temperature (° C.) | −3 | 13 | 56 | −32 |

ODX688: aliphatic polyester diol, manufactured by Dainippon Ink Chemical Industry Co., Ltd. trade name: POLYLITE ODX-688, number-average molecular weight of 2000
NPG: 2,2-dimethyl-1,3-propanediol
HD: 1,6-hexanediol
PLACCEL 220: polycaprolactonediol, manufactured by Daicel Chemical Industries, LTD. trade name: PLACCEL 220, number-average molecular weight of 2000
MDI: 4,4'-diphenylmethane diisocyanate

TABLE 1

|  |  |  | Polyester resin | | | | |
|---|---|---|---|---|---|---|---|
|  |  |  | I | II | III | IV | V |
| Composition ratio (molar ratio) | dibasic acid | terephthalic acid | 49 | 30 | 50 | 50 | 50 |
|  |  | isophthalic acid | 49 | 70 | 50 | 50 | 50 |
|  |  | trimellitic acid | 2 |  |  |  |  |
|  | glycol | 1,5-pentanediol |  | 86 | 50 |  |  |
|  |  | ethylene glycol | 55 |  |  |  | 50 |
|  |  | neopentyl glycol | 45 | 14 | 50 | 45 | 50 |
|  | caprolactone | PLACCEL M | 140 | 100 |  | 55 |  |
| Physical properties |  | reduced viscosity (dl/g) | 1.2 | 0.7 | 0.7 | 1.2 | 0.7 |
|  |  | glass transition temperature (° C.) | −18 | −28 | 30 | 26 | 67 |

PLACCEL M: ε-caprolactone, manufactured by Daicel Chemical Industries, LTD. trade name: PLACCEL M

TABLE 4

|  |  |  | Example 1 | Example 2 | Example 3 | Example 4 | Example 5 | Example 6 | Example 7 | Example 8 | Example 9 |
|---|---|---|---|---|---|---|---|---|---|---|---|
| Compounding | conductive powder (A) | conductive powder | A | A | A | A | A | A | A | A | A |
|  |  | parts by weight | 56.0 | 56.0 | 56.0 | 22.9 | 56.0 | 56.0 | 56.0 | 56.0 | 56.0 |
|  | vinyl chloride-vinyl acetate resin (B) | vinyl chloride-vinyl acetate resin | I | I | I | II | II | II | I | I | III |
|  |  | parts by solid | 3.4 | 5.8 | 3.4 | 3.4 | 3.4 | 3.4 | 2.5 | 7.7 | 3.4 |
|  | polyester resin and/or polyurethane resin (C) | urethane resin |  |  |  |  | I | II |  |  | IV |
|  |  | parts by solid |  |  |  |  | 8.2 | 8.2 |  |  | 8.2 |
|  |  | polyester resin | I | II | II | I |  |  | I | I |  |
|  |  | parts by solid | 8.2 | 5.8 | 8.2 | 8.2 |  |  | 9.1 | 3.9 |  |
|  | curing agent (D) | curing agent | I | I | II | I | II | I | I | I | I |
|  |  | parts by solid | 4.5 | 4.5 | 4.5 | 4.5 | 4.5 | 4.5 | 4.6 | 4.5 | 4.5 |
|  | organic solvent (E) (parts by weight) | 2-butoxyethyl acetate | 4.1 | 3.0 | 4.1 | 4.1 | 4.1 | 4.1 | 4.4 | 1.3 | 4.1 |
|  |  | 2-(2-ethoxyethoxy)ethyl acetate | 12.2 | 9.0 | 12.2 | 12.2 | 12.2 | 12.2 | 13.9 | 4.0 | 12.2 |
|  |  | cyclohexanone | 6.6 | 10.9 | 6.6 | 6.6 | 6.6 | 6.6 | 4.4 | 16.6 | 6.6 |
|  | imidazole type catalyst (parts by weight) |  | 0.4 | 0.4 | 0.4 | 0.4 | 0.4 | 0.4 | 0.4 | 0.4 | 0.4 |
|  | leveling agent (parts by weight) |  | 0.5 | 0.5 | 0.5 | 0.5 | 0.5 | 0.5 | 0.5 | 0.5 | 0.5 |
| Paste characteristics | solid component of the paste (%) |  | 74.0 | 74.0 | 74.0 | 74.0 | 74.0 | 74.0 | 74.0 | 74.0 | 74.0 |
|  | viscosity (dPa·s) |  | 300 | 300 | 300 | 200 | 300 | 300 | 300 | 300 | 300 |
|  | thixotropicity |  | 1.9 | 1.9 | 1.9 | 1.9 | 1.9 | 1.9 | 1.9 | 1.9 | 1.9 |
|  | filler dispersibility |  | good | good | good | good | good | good | good | good | good |
| Coating film physical property | hardness of the paste cured coating film |  | HB | F | HB | HB | HB | HB | HB | HB | HB |
|  | specific resistance of the conductive paste ($\times 10^{-4}$ $\Omega \cdot cm$) |  | 4.0 | 2.7 | 3.8 | 468.2 | 3.5 | 3.4 | 4.0 | 4.0 | 3.9 |
|  | close adhesiveness of the paste cured coating film |  | 100/100 | 100/100 | 100/100 | 100/100 | 100/100 | 100/100 | 100/100 | 100/100 | 100/100 |
|  | close adhesiveness after the environment load test | heat resistance | 100/100 | 100/100 | 100/100 | 100/100 | 100/100 | 100/100 | 100/100 | 100/100 | 100/100 |
|  |  | humidity resistance | 100/100 | 100/100 | 100/100 | 100/100 | 100/100 | 100/100 | 100/100 | 100/100 | 100/100 |
|  |  | heat shock resistance | 100/100 | 100/100 | 100/100 | 100/100 | 100/100 | 100/100 | 100/100 | 100/100 | 100/100 |
|  |  | coldness resistance | 100/100 | 100/100 | 100/100 | 100/100 | 100/100 | 100/100 | 100/100 | 100/100 | 100/100 |
|  | electrolytic plating property |  | good | good | good | good | good | good | good | good | good |
|  | close adhesiveness after electrolytic plating |  | 100/100 | 100/100 | 100/100 | 100/100 | 100/100 | 100/100 | 100/100 | 100/100 | 100/100 |
|  | close adhesiveness after electrolytic plating and the environment load test | heat resistance | 100/100 | 100/100 | 100/100 | 100/100 | 100/100 | 100/100 | 100/100 | 100/100 | 100/100 |
|  |  | humidity resistance | 100/100 | 100/100 | 100/100 | 95/100 | 100/100 | 100/100 | 100/100 | 100/100 | 100/100 |
|  |  | heat shock resistance | 100/100 | 100/100 | 100/100 | 100/100 | 100/100 | 100/100 | 100/100 | 100/100 | 100/100 |
|  |  | coldness resistance | 100/100 | 100/100 | 100/100 | 100/100 | 100/100 | 100/100 | 100/100 | 100/100 | 100/100 |
|  | non-electrolytic plating property |  | good | good | good | good | good | good | good | good | good |
|  | close adhesiveness after non-electrolytic plating |  | 100/100 | 100/100 | 100/100 | 100/100 | 100/100 | 100/100 | 100/100 | 100/100 | 100/100 |
|  | close adhesiveness after non-electrolytic plating and the environment load test | heat resistance | 100/100 | 100/100 | 100/100 | 100/100 | 100/100 | 100/100 | 100/100 | 100/100 | 100/100 |
|  |  | humidity resistance | 100/100 | 98/100 | 97/100 | 95/100 | 97/100 | 97/100 | 97/100 | 97/100 | 95/100 |
|  |  | heat shock resistance | 100/100 | 100/100 | 100/100 | 100/100 | 100/100 | 100/100 | 100/100 | 100/100 | 100/100 |
|  |  | coldness resistance | 100/100 | 100/100 | 100/100 | 100/100 | 100/100 | 100/100 | 100/100 | 100/100 | 100/100 |
|  | gel fraction ratio of a paste soluble solid component (%) |  | 75 | 60 | 50 | 68 | 72 | 78 | 85 | 53 | 70 | solvent: 2-butoxyethyl acetate, manufactured by Daicel Chemical Industries, LTD. 2-(2-ethoxyethoxy)ethyl acetate, manufactured by Daicel Chemical Industries, LTD. cyclohexanone, manufactured by Kanto Denka Kogyo Co., LTD.
imidazole type catalyst: imidazole, manufactured by Nippon Synthetic Chemical Industry Co., LTD
leveling agent: a mixture of acrylic polymer/vinylether polymer, manufactured by Kyoeisha Chemical Co., LTD. trade name: FLOWLEN AC300

TABLE 5

|  |  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|
| Compounding | conductive powder (A) | conductive powder | A | B | B | A | A | B | A | A |
|  |  | parts by weight | 77.0 | 77.0 | 89.0 | 56.0 | 56.0 | 16.5 | 56.0 | 77.0 |
|  | vinyl chloride-vinyl acetate resin (B) | vinyl chloride-vinyl acetate resin |  |  | II | I | II | II | I |  |
|  |  | parts by solid |  |  | 3.0 | 3.4 | 3.4 | 3.4 | 3.4 |  |
|  | polyester resin and/or polyurethane resin (C) | urethane resin | IV |  |  |  | III | II |  |  |
|  |  | parts by solid | 17.3 |  |  |  | 8.2 | 8.2 |  |  |
|  |  | polyester resin |  | IV | IV | V |  |  | I | III |
|  |  | parts by solid |  | 17.3 | 12.0 | 8.2 |  |  | 8.2 | 17.3 |
|  | curing agent (D) | curing agent | III | III |  | II | I | II | III | III |
|  |  | parts by solid | 5.7 | 5.7 |  | 4.5 | 4.5 | 4.5 | 4.5 | 5.7 |
|  | organic solvent (E) (parts by weight) | 2-butoxyethyl acetate | 5.1 | 5.1 | 4.1 | 4.1 | 4.1 | 4.1 | 4.1 | 5.1 |
|  |  | 2-(2-ethoxyethoxy)ethyl acetate | 15.2 | 15.2 | 12.2 | 12.2 | 12.2 | 12.2 | 12.2 | 15.2 |

TABLE 5-continued

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| weight) | cyclohexanone |  |  | 6.6 | 6.6 | 6.6 | 6.6 | 6.6 |  |
|  | imidazole type catalyst (parts by weight) | 0.4 | 0.4 | 0.4 | 0.4 | 0.4 | 0.4 | 0.4 | 0.4 |
|  | leveling agent (parts by weight) | 0.5 | 0.5 | 0.5 | 0.5 | 0.5 | 0.5 | 0.5 | 0.5 |
| Paste characteristics | solid component of the paste (%) | 83.1 | 83.1 | 81.9 | 74.0 | 74.0 | 74.0 | 74.0 | 83.1 |
|  | viscosity (dPa·s) | 200 | 200 | 250 | 350 | 300 | 300 | 300 | 200 |
|  | thixotropicity | 2.9 | 2.9 | 3.6 | 1.9 | 1.9 | 1.9 | 1.9 | 2.9 |
|  | filler dispersibility | good | good | good | good | good | good | good | good |
| Coating film physical property | hardness of the paste cured coating film | HB | F | HB | HB | HB | HB | HB | HB |
|  | specific resistance of the conductive paste ($\times 10^{-4}\ \Omega \cdot cm$) | 0.5 | 0.5 | 3.3 | 3.2 | 3.9 | 2800 | 4.0 | 0.5 |
|  | close adhesiveness of the paste cured coating film | 100/100 | 100/100 | 100/100 | 100/100 | 100/100 | 100/100 | 100/100 | 100/100 |
| close adhesiveness after the environment load test | heat resistance | 100/100 | 100/100 | 100/100 | 100/100 | 100/100 | 100/100 | 100/100 | 100/100 |
|  | humidity resistance | 100/100 | 100/100 | 100/100 | 100/100 | 100/100 | 100/100 | 100/100 | 100/100 |
|  | heat shock resistance | 100/100 | 100/100 | 100/100 | 100/100 | 100/100 | 100/100 | 100/100 | 100/100 |
|  | coldness resistance | 100/100 | 100/100 | 100/100 | 100/100 | 100/100 | 100/100 | 100/100 | 100/100 |
|  | electrolytic plating property | good | good | good | good | good | good | good | good |
|  | close adhesiveness after electrolytic plating | 100/100 | 100/100 | 100/100 | 100/100 | 100/100 | 100/100 | 100/100 | 100/100 |
| close adhesiveness after electrolytic plating and the environment load test | heat resistance | 100/100 | 100/100 | 80/100 | 100/100 | 100/100 | 100/100 | 100/100 | 100/100 |
|  | humidity resistance | 95/100 | 95/100 | 70/100 | 70/100 | 80/100 | 70/100 | 0/100 | 95/100 |
|  | heat shock resistance | 100/100 | 100/100 | 100/100 | 100/100 | 100/100 | 100/100 | 60/100 | 100/100 |
|  | coldness resistance | 100/100 | 100/100 | 100/100 | 100/100 | 100/100 | 100/100 | 40/100 | 100/100 |
|  | non-electrolytic plating property | good | good | good | good | good | good | good | good |
|  | close adhesiveness after non-electrolytic plating | 50/100 | 30/100 | 40/100 | 35/100 | 80/100 | 90/100 | 100/100 | 70/100 |
| close adhesiveness after non-electrolytic plating and the environment load test | heat resistance | 50/100 | 30/100 | 40/100 | 45/100 | 80/100 | 90/100 | 100/100 | 50/100 |
|  | humidity resistance | 20/100 | 10/100 | 10/100 | 0/100 | 30/100 | 10/100 | 0/100 | 40/100 |
|  | heat shock resistance | 30/100 | 30/100 | 20/100 | 35/100 | 70/100 | 70/100 | 50/100 | 60/100 |
|  | coldness resistance | 20/100 | 20/100 | 0/100 | 20/100 | 50/100 | 50/100 | 20/100 | 40/100 |
|  | gel fraction ratio of a paste soluble solid component (%) | 5 | 7 | 0 | 55 | 48 | 68 | 0 | 3 |

TABLE 6

|  |  |  | Example 10 | Example 11 | Example 12 | Comparative Example 9 | Comparative Example 10 | Comparative Example 11 |
|---|---|---|---|---|---|---|---|---|
| Compounding | conductive powder (A) | conductive powder | A | A | A | B | A | A |
|  |  | parts by weight | 56.0 | 56.0 | 56.0 | 89.0 | 56.0 | 56.0 |
|  | vinyl chloride-vinyl acetate resin (B) | vinyl chloride-vinyl acetate resin | I | I | II | II | I | II |
|  |  | parts by solid | 3.4 | 5.8 | 3.4 | 3.0 | 3.4 | 3.4 |
|  | polyester resin and/or polyurethane resin (C) | urethane resin | | IV | | | | III |
|  |  | parts by solid | | 5.8 | | | | 8.2 |
|  |  | polyester resin | I | | II | IV | V | |
|  |  | parts by solid | 8.2 | | 8.2 | 12.0 | 8.2 | |
|  | curing agent (D) | curing agent | I | I | II | | II | I |
|  |  | parts by solid | 4.5 | 4.5 | 4.5 | | 4.5 | 4.5 |
|  | organic solvent (E) (parts by weight) | 2-butoxyethyl acetate | 4.1 | 3.0 | 4.1 | 4.6 | 4.1 | 4.1 |
|  |  | 2-(2-ethoxyethoxy)ethyl acetate | 12.2 | 9.0 | 12.2 | 13.9 | 12.2 | 12.2 |
|  |  | cyclohexanone | 6.6 | 10.9 | 6.6 | 4.4 | 6.6 | 6.6 |
|  | imidazole type catalyst (parts by weight) | | 0.4 | 0.4 | 0.4 | 0.4 | 0.4 | 0.4 |
|  | leveling agent (parts by weight) | | 0.5 | 0.5 | 0.5 | 0.5 | 0.5 | 0.5 |
| Paste characteristics | solid component of the paste (%) | | 74.0 | 74.0 | 74.0 | 81.9 | 74.0 | 74.0 |
|  | viscosity (dPa·s) | | 300 | 300 | 300 | 250 | 300 | 300 |
|  | thixotropicity | | 1.9 | 1.9 | 1.9 | 3.6 | 1.9 | 1.9 |
|  | filler dispersibility | | good | good | good | good | good | good |
| Coating film physical property | hardness of the paste cured coating film | | HB | F | HB | HB | HB | HB |
|  | specific resistance of the conductive paste ($\times 10^{-4}\ \Omega \cdot cm$) | | 4.0 | 2.7 | 3.8 | 3.3 | 3.2 | 3.9 |
|  | close adhesiveness of the paste cured coating film | | 100/100 | 100/100 | 100/100 | 100/100 | 100/100 | 100/100 |
| close adhesiveness after the environment load test | heat resistance | | 100/100 | 100/100 | 100/100 | 100/100 | 100/100 | 100/100 |
|  | humidity resistance | | 100/100 | 100/100 | 100/100 | 100/100 | 100/100 | 100/100 |
|  | heat shock resistance | | 100/100 | 100/100 | 100/100 | 100/100 | 100/100 | 100/100 |
|  | coldness resistance | | 100/100 | 100/100 | 100/100 | 100/100 | 100/100 | 100/100 |
|  | electrolytic plating property | | good | good | good | good | good | good |

TABLE 6-continued

|  |  | Example 10 | Example 11 | Example 12 | Comparative Example 9 | Comparative Example 10 | Comparative Example 11 |
|---|---|---|---|---|---|---|---|
| close adhesiveness after electrolytic plating | | 100/100 | 100/100 | 100/100 | 100/100 | 100/100 | 100/100 |
| close adhesiveness after electrolytic plating and the environment load test | heat resistance | 100/100 | 100/100 | 100/100 | 80/100 | 100/100 | 100/100 |
| | humidity resistance | 100/100 | 100/100 | 100/100 | 70/100 | 70/100 | 80/100 |
| | heat shock resistance | 100/100 | 100/100 | 100/100 | 100/100 | 100/100 | 100/100 |
| | coldness resistance | 100/100 | 100/100 | 100/100 | 100/100 | 100/100 | 100/100 |
| non-electrolytic plating property | | good | good | good | good | good | good |
| close adhesiveness after non-electrolytic plating | | 100/100 | 100/100 | 100/100 | 50/100 | 48/100 | 90/100 |
| close adhesiveness after non-electrolytic plating and the environment load test | heat resistance | 100/100 | 100/100 | 100/100 | 50/100 | 50/100 | 90/100 |
| | humidity resistance | 100/100 | 100/100 | 99/100 | 20/100 | 20/100 | 30/100 |
| | heat shock resistance | 100/100 | 100/100 | 100/100 | 30/100 | 50/100 | 90/100 |
| | coldness resistance | 100/100 | 100/100 | 100/100 | 15/100 | 40/100 | 50/100 |
| gel fraction ratio of a paste soluble solid component (%) | | 75 | 60 | 50 | 0 | 55 | 48 |

Example 13

The conductive paste of the present invention was printed as an antenna pattern by the pad printing process shown in FIG. 2 on a housing molded with use of a PC/ABS resin as a resin having a low heat resistance temperature, and was thermally cured at 80° C. for 30 minutes. Further, by an electrolytic plating process shown in FIG. 3, a conductive layer having a plating construction shown in FIG. 5 was formed thereon. The electrolytic plating process is carried out in the order from (1) through to (12).

(1) An object of plating is immersed into a degreasing liquid, so as to perform degreasing.

(2) Next, the resultant is washed with cleaning water.

(3) Next, in order to remove oxide film of the conductive powder contained in the conductive paste of the present invention, the resultant is immersed into an acid active treating solution.

(4) Next, the resultant is washed with cleaning water.

(5) Next, the resultant is immersed into an electrolytic Cu plating solution, and an electric current is applied to the conductive paste layer serving as an object of plating, so as to deposit Cu.

(6) Next, the resultant is washed with cleaning water.

(7) Next, in order to remove oxide film of the Cu plated film, the resultant is immersed into an acid active treating solution.

(8) Next, the resultant is washed with cleaning water.

(9) Next, the resultant is immersed into an electrolytic Ni plating solution, and an electric current is applied to the Cu plated layer, so as to deposit Ni.

(10) Next, the resultant is washed with cleaning water.

(11) Next, the resultant is immersed into an electrolytic Au plating solution, and an electric current is applied to the Ni plated layer, so as to deposit Au.

(12) Next, the resultant is washed with cleaning water.

FIG. 6(a) is a perspective view of a notebook type personal computer 41 on which a housing-integrated type antenna circuit is mounted, where a housing-integrated type antenna circuit 44 is mounted on the outside of the upper lid (housing) 43 in which the display 42 is disposed. FIG. 6(b) is a perspective view in which only the housing-integrated type antenna circuit 44 mounted on the notebook type personal computer 41 is taken out, where the antenna circuit is incorporated in the housing.

For the pad printing process of Example 13, the method shown in FIG. 2 was used as an example. Here, first, a (desired) antenna pattern 21 made of the conductive paste was prepared, and then this antenna pattern 21 was subjected to first printing on the convex part of the pad 22, and thereafter the antenna pattern 21 on the convex part of the pad 22 was subjected to second printing at a predetermined position on an insulating substrate 23 such as a housing. Also, as a construction of plating shown in FIG. 5, a coating film 32 formed from the conductive paste was formed on an insulating substrate 31 constituting a housing, and subsequently, each film of Cu 33, Ni 34, and Au 35 was successively formed thereon, so as to construct a plated layer made of three films.

Example 14

The conductive paste of the present invention was printed as an antenna pattern by the pad printing process shown in FIG. 2 on a housing molded with use of a PC/ABS resin as a resin having a low heat resistance temperature, and was thermally cured at 80° C. for 30 minutes. Further, by a non-electrolytic plating process shown in FIG. 4, a conductive layer having a plating construction shown in FIG. 5 was formed thereon. The non-electrolytic plating step is carried out in the order from (1) through to (16).

(1) An object of plating is immersed into a degreasing liquid, so as to perform degreasing.

(2) Next, the resultant is washed with cleaning water.

(3) Next, in order to remove oxide film of the conductive powder contained in the conductive paste of the present invention, the resultant is immersed into an acid active treating solution.

(4) Next, the resultant is washed with cleaning water.

(5) Next, the resultant is immersed into a catalyst imparting treating solution in order to impart a catalyst.

(6) Next, the resultant is washed with cleaning water.

(7) Next, the resultant is immersed into a non-electrolytic Cu plating solution to deposit Cu.

(8) Next, the resultant is washed with cleaning water.

(9) Next, the resultant is immersed into a catalyst imparting treating solution in order to impart a catalyst.

(10) Next, the resultant is washed with cleaning water.

(11) Next, in order to prevent deposition outside of the pattern, the resultant is immersed into a post-activator treating solution to remove the catalyst adhering to the outside of the pattern.

(12) Next, the resultant is washed with cleaning water.

(13) Next, the resultant is immersed into a non-electrolytic Ni plating solution to deposit Ni.

(14) Next, the resultant is washed with cleaning water.

(15) Next, the resultant is immersed into a non-electrolytic Au plating solution to deposit Au.

(16) Next, the resultant is washed with cleaning water.

Figure 6:
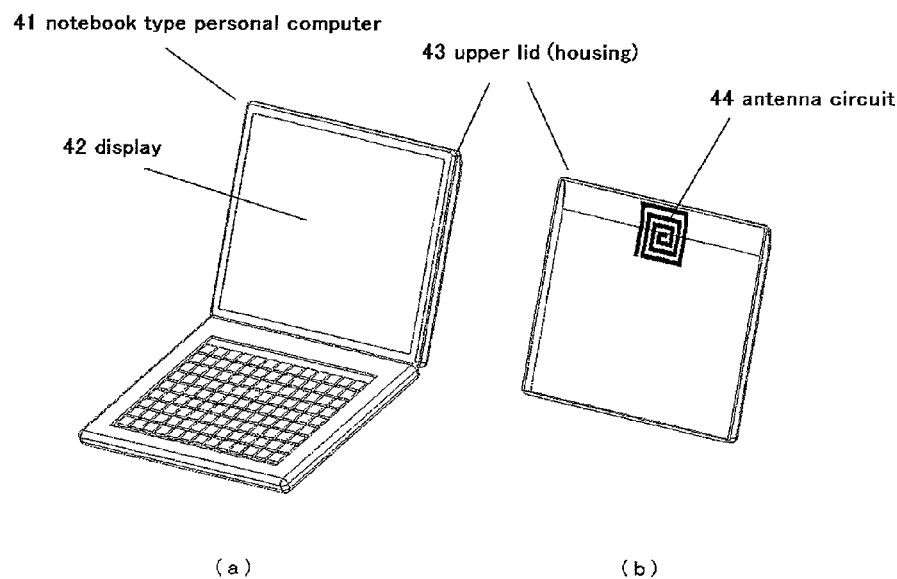
FIG. 6 is a schematic view of one example of a housing-integrated type antenna according to an embodiment of the present invention.

FIG. 6(a) is a perspective view of a notebook type personal computer 41 on which a housing-integrated type antenna circuit is mounted, where a housing-integrated type antenna circuit 44 is mounted on the outside of the upper lid (housing) 43 in which the display 42 is disposed. FIG. 6(*b*) is a perspective view in which only the housing-integrated type antenna circuit 44 mounted on the notebook type personal computer 41 is taken out, where the antenna circuit is incorporated in the housing.

For the process of the pad printing of Example 14, the method shown in FIG. 2 was used in the same manner as described in Example 13. Also, as a construction of plating shown in FIG. 5, a coating film 32 formed from the conductive paste was formed on an insulating substrate 31 constituting a housing in the same manner as described in Example 13, and subsequently, each film of Cu 33, Ni 34, and Au 35 was successively formed thereon, so as to construct a plated layer made of three films.

The invention claimed is:

1. A conductive paste containing a conductive powder (A) having a dendrite structure, a vinyl chloride-vinyl acetate resin (B), a polyester resin and/or polyurethane resin (C), a blocked isocyanate (D) blocked with an active methylene compound, and an organic solvent (E),
wherein
the resin (C) has a glass transition temperature of −50° C. to 20° C.,
a sum of amounts of the resin (C) is 50 to 400 parts by weight relative to 100 parts by weight of the resin (B), and
a sum of amounts of the resin (B), the resin (C) component, and the blocked isocyanate (D) is 10 to 60 parts by weight relative to 100 parts by weight of the conductive powder (A).

2. The conductive paste of claim 1, wherein a gel fraction ratio of a soluble solid component within the conductive paste when a heat treatment at 80° C. and for 30 minutes is applied to the soluble solid component is 40% to 100%.

3. An electric wiring comprising an insulating substrate and a film thereon formed from the conductive paste of claim 2.

4. The electric wiring of claim 3, which further comprises a plated layer.

5. An apparatus comprising the electric wiring of claim 4 mounted thereon.

6. An apparatus comprising the electric wiring of claim 3 mounted thereon.

7. A method of manufacturing an electric wiring, which method comprises printing and/or applying the conductive paste of claim 2 on an insulating substrate and then heating the conductive paste to form an electric wiring on the insulating substrate.

8. The conductive paste of claim 1, wherein the resin (B) has been obtained by copolymerizing components containing a hydroxyl group.

9. An electric wiring comprising an insulating substrate and a film thereon formed from the conductive paste of claim 8.

10. The electric wiring of claim 9, which further comprises a plated layer.

11. An apparatus comprising the electric wiring of claim 10 mounted thereon.

12. An apparatus comprising the electric wiring of claim 9 mounted thereon.

13. A method of manufacturing an electric wiring, which method comprises printing and/or applying the conductive paste of claim 8 on an insulating substrate and then heating the conductive paste to form an electric wiring on the insulating substrate.

14. The conductive paste of claim 1, wherein an acid value of the resin (B) is 2 mg KOH/g or less.

15. An electric wiring comprising an insulating substrate and a film thereon formed from the conductive paste of claim 14.

16. The electric wiring of claim 15, which further comprises a plated layer.

17. An apparatus comprising the electric wiring of claim 16 mounted thereon.

18. An apparatus comprising the electric wiring of claim 15 mounted thereon.

19. A method of manufacturing an electric wiring, which method comprises printing and/or applying the conductive paste of claim 14 on an insulating substrate and then heating the conductive paste to form an electric wiring on the insulating substrate.

20. An electric wiring comprising an insulating substrate and a film thereon formed from the conductive paste of claim 1.

21. The electric wiring of claim 20, which further comprises a plated layer.

22. An apparatus comprising the electric wiring of claim 21 mounted thereon.

23. An apparatus comprising the electric wiring of claim 20 mounted thereon.

24. A method of manufacturing an electric wiring, which method comprises printing and/or applying the conductive paste of claim 1 on an insulating substrate and then heating the conductive paste to form an electric wiring on the insulating substrate.

\* \* \* \* \*